US007728955B2

(12) United States Patent
Munnig Schmidt

(10) Patent No.: US 7,728,955 B2
(45) Date of Patent: Jun. 1, 2010

(54) LITHOGRAPHIC APPARATUS, RADIATION SUPPLY AND DEVICE MANUFACTURING METHOD

(75) Inventor: Robert-Han Munnig Schmidt, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 635 days.

(21) Appl. No.: 11/384,859

(22) Filed: Mar. 21, 2006

(65) Prior Publication Data
US 2007/0222961 A1    Sep. 27, 2007

(51) Int. Cl.
G03B 27/72    (2006.01)
(52) U.S. Cl. ........................................ 355/69
(58) Field of Classification Search ............... 250/491, 250/492; 355/53, 67, 69, 71; 219/121
See application file for complete search history.

(56) References Cited

U.S. PATENT DOCUMENTS

| 5,229,872 A | 7/1993 | Mumola |
| 5,296,891 A | 3/1994 | Vogt et al. |
| 5,523,193 A | 6/1996 | Nelson |
| 6,541,731 B2 * | 4/2003 | Mead et al. ............... 219/121.7 |
| 6,753,947 B2 * | 6/2004 | Meisburger et al. ........... 355/69 |
| 7,027,155 B2 * | 4/2006 | Cordingley et al. ......... 356/401 |
| 7,295,362 B2 * | 11/2007 | Meisburger ................. 359/290 |
| 7,297,934 B2 * | 11/2007 | Kane ........................... 250/230 |
| 2002/0186359 A1* | 12/2002 | Meisburger et al. ........... 355/69 |
| 2004/0021840 A1* | 2/2004 | Heintze ........................ 355/30 |
| 2004/0126694 A1* | 7/2004 | Devoe et al. .............. 430/270.1 |
| 2004/0239907 A1* | 12/2004 | Hintersteiner et al. ......... 355/67 |
| 2005/0024615 A1* | 2/2005 | Bleeker ........................ 355/67 |
| 2005/0195380 A1* | 9/2005 | Sytsma et al. .................. 355/69 |
| 2005/0274909 A1* | 12/2005 | Teunissen et al. ......... 250/491.1 |
| 2008/0291417 A1* | 11/2008 | Visser et al. ................... 355/67 |

FOREIGN PATENT DOCUMENTS

| WO | 98/33096 | 7/1998 |
| WO | 98/38597 | 9/1998 |

* cited by examiner

*Primary Examiner*—Georgia Y Epps
*Assistant Examiner*—Danell L Owens
(74) *Attorney, Agent, or Firm*—Sterne, Kessler, Goldstein & Fox P.L.L.C

(57) ABSTRACT

A system for controlling the radiation dose in a pulse of radiation having a relatively large dose, in which a pulsed beam of radiation is divided into a plurality of pulsed sub-beams of radiation and the radiation dose of the pulses is adjusted after the radiation beam has been divided.

21 Claims, 10 Drawing Sheets

LITHOGRAPHIC APPARATUS, RADIATION SUPPLY AND DEVICE MANUFACTURING METHOD

FIELD

The present invention relates to a lithographic apparatus, a radiation supply and a method for manufacturing a device.

BACKGROUND

A lithographic apparatus is a machine that applies a desired pattern onto a substrate or part of a substrate. A lithographic apparatus may be used, for example, in the manufacture of flat panel displays, integrated circuits (ICs) and other devices involving fine structures. In a conventional apparatus, a patterning device, which may be referred to as a mask or a reticle, may be used to generate a circuit pattern corresponding to an individual layer of a flat panel display (or other device). This pattern may be transferred on (part of) the substrate (e.g. a glass plate), e.g. via imaging onto a layer of radiation-sensitive material (resist) provided on the substrate.

Instead of a circuit pattern, the patterning means may be used to generate other patterns, for example a color filter pattern, or a matrix of dots. Instead of a mask, the patterning device may comprise a patterning array that comprises an array of individually controllable elements. An advantage of such a system compared to a mask-based system is that the pattern can be changed more quickly and for less cost.

A flat panel display substrate may be rectangular in shape. Lithographic apparatus designed to expose a substrate of this type may provide an exposure region which covers a full width of the rectangular substrate, or which covers a portion of the width (for example half of the width). The substrate may be scanned underneath the exposure region, whilst the mask or reticle is synchronously scanned through the projection beam. In this way, the pattern is transferred to the substrate. If the exposure region covers the full width of the substrate then exposure may be completed with a single scan. If the exposure region covers, for example, half of the width of the substrate, then the substrate may be moved transversely after the first scan, and a further scan is typically performed to expose the remainder of the substrate.

In the manufacture of devices using a so-called maskless lithographic apparatus (namely one in which the mask has been replaced by a programmable patterning array), a pulsed radiation source may be used. Between pulses of radiation, the pattern programmed on the programmable patterning array may be updated and the substrate advanced relative to the patterned radiation beam such that a series of patterned images (which will typically be different from each other) are projected on to the substrate. In such an arrangement, in order to ensure that the overall quality of the complete image formed is of an acceptable level, it is desirable to ensure that the dose of radiation within successive pulses are as similar as possible in order to minimise differences between images projected on to the substrate by different pulses. For example, if the radiation dose of a first pulse of the radiation system is greater than the radiation dose of a second pulse of the radiation system, the critical dimension (CD) of an image projected on to the substrate by the first pulse may differ from the critical dimension of an image projected on to the substrate by the second pulse, even if the intended patterns are identical.

Unfortunately, conventionally known radiation sources that provide a pulsed beam of radiation with the required radiation wavelength and frequency of pulsing, are not able to provide the required pulse to pulse dose stability. It has therefore previously been proposed to provide a mechanism for adjusting the radiation dose within pulses of radiation after the pulses have been generated by the radiation source in order to reduce the radiation dose variation between pulses. However, for a maskless lithographic apparatus to be used for commercial manufacture of devices, the radiation source must provide as large a radiation dose as possible within each pulse of radiation. This is because the larger the dose of radiation within a pulse, the larger the area on a substrate on which a patterned image can be projected. Accordingly, the larger the radiation dose within a pulse of radiation, the faster the entire image to be projected on the substrate can be completed, leading to a shorter processing time for the substrate and a more efficient and more cost-effective lithographic apparatus. However, the presently known mechanisms for adjusting the radiation dose within a pulse of radiation are not suitable for use with radiation sources that generate radiation pulses with sufficiently high doses for a commercial lithographic apparatus.

SUMMARY

Embodiments of the present invention provide a system for controlling the dose of radiation within a pulse from a pulsed radiation source that is capable of being used with a radiation source generating pulses with a sufficiently high radiation dose for use with a lithographic apparatus.

In an embodiment of the present invention there is provided a lithographic projection apparatus comprising: an illumination system configured to condition a pulsed beam of radiation; a radiation beam divider configured to divide the pulsed beam of radiation into at least first and second pulsed sub-beams of radiation; at least one sensor, configured to determine the radiation dose of a pulse of radiation in at least one of the pulsed beam of radiation and the pulsed sub-beams of radiation; an optical delay line, configured to delay a pulse of radiation after the radiation dose of the pulse has been determined by said at least one sensor; a first radiation pulse modulator, configured to adjust the radiation dose of a pulse of radiation in said first pulsed sub-beam of radiation based on the radiation dose of said pulse determined by said at least one sensor; and a second radiation pulse modulator, configured to adjust the radiation dose of a pulse of radiation in said second pulsed sub-beam of radiation based on the radiation dose of said pulse determined by said at least one sensor.

In an embodiment of the present invention there is provided a device manufacturing method, comprising conditioning a pulsed beam of radiation; dividing the pulsed beam of radiation into at least first and second pulsed sub-beams of radiation; determining the radiation dose of at least one pulse of radiation in at least one of said pulsed beam of radiation and pulsed sub-beams of radiation; delaying said pulse of radiation in an optical delay line after the radiation dose of the pulse has been determined; adjusting the radiation dose of a pulse of radiation in said first pulsed sub-beam of radiation based on said determined radiation dose of said at least one pulse; and adjusting the radiation dose of a pulse of radiation in said second pulsed sub-beam of radiation based on said determined radiation dose of said at least one pulse.

In an embodiment of the present invention there is provided a radiation supply system suitable for use with a pulsed source of radiation, comprising: a radiation beam divider configured to divide a pulsed beam of radiation into at least first and second pulsed sub-beams of radiation; at least one sensor, configured to determine the radiation dose within a pulse of radiation in at least one of the pulsed beam of radiation and the pulsed sub-beams of radiation; an optical delay line, configured to delay a pulse of radiation after the radiation dose of the pulse has been determined by the sensor; a first radiation modulator, configured to adjust the radiation dose of a pulse of radiation in said first pulsed sub-beam of radiation based on the radiation dose of said pulse determined by said at least one sensor; a second radiation modulator, configured to adjust the radiation dose of a pulse of radiation in said second pulsed sub-beam of radiation based on the radiation dose of said pulse determined by said at least one sensor.

DETAILED DESCRIPTION

Figure 1:
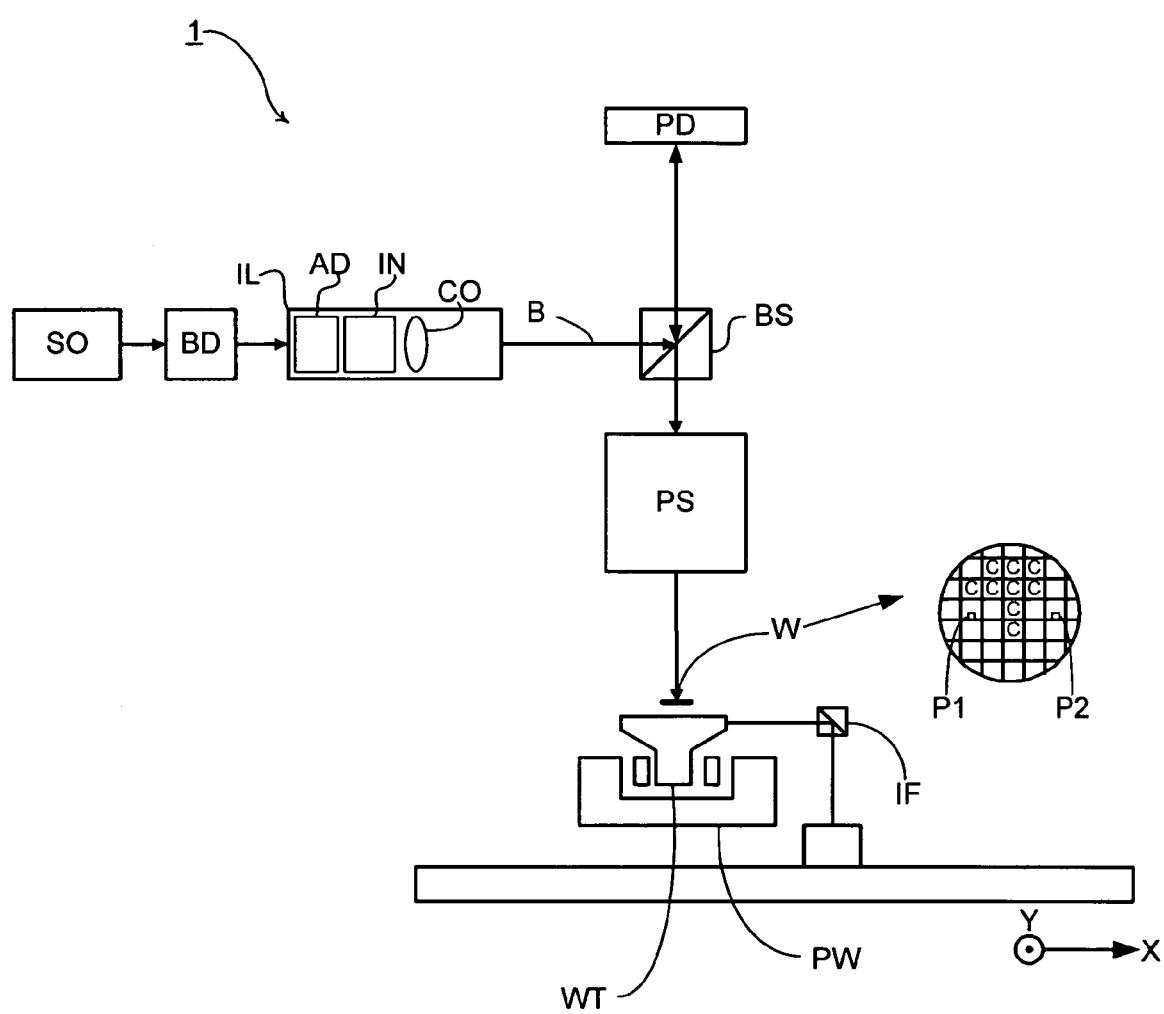
FIG. 1 depicts a lithographic apparatus according to an embodiment of the present invention.

FIG. 1 schematically depicts a lithographic apparatus according to an embodiment of the invention. The apparatus comprises:

an illumination system (illuminator) IL configured to condition a radiation beam B (e.g. UV radiation);

a patterning device PD (e.g. an array of individually controllable elements) that modulates the projection beam; in general the position of the array of individually controllable elements will be fixed relative to item PS; however it may instead be connected to a positioner configured to accurately position the array of individually controllable elements in accordance with certain parameters;

a substrate table WT constructed to support a substrate (e.g. a resist-coated substrate) W and connected to a positioner PW configured to accurately position the substrate in accordance with certain parameters; and a projection system (e.g. a refractive projection lens system) PS configured to project the beam of radiation modulated by the array of individually controllable elements onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The term "patterning device", used herein should be broadly interpreted as referring to any device that can be used to modulate the cross-section of a radiation beam such as to create a pattern in a target portion of the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. Patterning devices whose pattern is programmable with the aid of electronic means (e.g., a computer), such as patterning devices comprising a plurality of programmable elements, that can each modulate the intensity of a portion of the radiation beam (e.g., all the devices mentioned in the previous sentence except for the reticle), are collectively referred to herein as "contrast devices". It should be appreciated that an electronically programmable patterning device having a plurality of programmable elements that impart a pattern to the radiation beam by modulating the phase of a portion of the radiation beam relative to adjacent portions of the radiation beam may also be used. In an embodiment of the present invention, the patterning device comprises at least 10 programmable elements, e.g. at least 100, at least 1000, at least 10000, at least 100000, at least 1000000, or at least 10000000 programmable elements. Embodiments of several of these devices are discussed in some more detail below.

A programmable mirror array. This may comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the said undiffracted light can be filtered out of the reflected beam, leaving only the diffracted light to reach the substrate; in this manner, the beam becomes patterned according to the addressing pattern of the matrix-addressable surface. It will be appreciated that, as an alternative, the filter may filter out the diffracted light, leaving the undiffracted light to reach the substrate. An array of diffractive optical MEMS devices may also be used in a corresponding manner. A diffractive optical MEMS device is comprised of a plurality of reflective ribbons that may be deformed relative to one another to form a grating that reflects incident light as diffracted light. A further alternative embodiment of a programmable mirror array employs a matrix arrangement of tiny mirrors, each of which may be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors. The required matrix addressing may be performed using suitable electronic means. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference in their entirety.

A programmable LCD array. An example of such a construction is given in U.S. Pat. No. 5,229,872, which is incorporated herein by reference in its entirety.

The lithographic apparatus may comprise one or more patterning devices. For example, it may have a plurality of arrays of individually controllable elements, each controlled independently of each other. In such an arrangement, some or all of the arrays of individually controllable elements may have at least one of a common illumination system (or part of an illumination system), a common support structure for the arrays of individually controllable elements and/or a common projection system (or part of the projection system).

In an embodiment of the present invention, such as the embodiment depicted in FIG. 1, the substrate W has a substantially circular shape, optionally with a notch and/or a flattened edge along part of its perimeter. In an embodiment of the present invention, the substrate has a polygonal shape, e.g. a rectangular shape. Embodiments of the present inventions where the substrate has a substantially circular shape include embodiments where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment of the present invention, the substrate has a diameter of at most 500 mm, at most 400 mm, at most 350 mm, at most 300 mm, at most 250 mm, at most 200 mm, at most 150 mm, at most 100 mm, or at most 75 mm. Embodiments of the present inventions where the substrate is polygonal, e.g. rectangular, include embodiments where at least one side, e.g. at least 2 sides or at least 3 sides, of the substrate has a length of at least 5 cm, e.g. at least 25 cm, at least 50 cm, at least 100 cm, at least 150 cm, at least 200 cm, or at least 250 cm. In an embodiment of the present invention, at least one side of the substrate has a length of at most 1000 cm, e.g. at most 750 cm, at most 500 cm, at most 350 cm, at most 250 cm, at most 150 cm, or at most 75 cm. In an embodiment of the present invention, the substrate is a rectangular substrate having a length of about 250-350 cm and a width of about 250-300 cm. The thickness of the substrate may vary and, to an extent, may depend, e.g., on the substrate material and/or the substrate dimensions. In an embodiment of the present invention, the thickness is at least 50 µm, for instance at least 100 µm, at least 200 µm, at least 300 µm, at least 400 µm, at least 500 µm, or at least 600 µm. In one embodiment of the present invention, the thickness of the substrate is at most 5000 µm, for instance at most 3500 µm, at most 2500 µm, at most 1750 µm, at most 1250 µm, at most 1000 µm, at most 800 µm, at most 600 µm, at most 500 µm, at most 400 µm, or at most 300 µm. The substrate referred to herein may be processed, before or after exposure, in for example a track (a tool that typically applies a layer of resist to a substrate and develops the exposed resist), a metrology tool and/or an inspection tool.

In an embodiment of the present invention, a resist layer is provided on the substrate. In an embodiment of the present invention, the substrate W is a wafer, for instance a semiconductor wafer. In an embodiment of the present invention, the wafer material is selected from the group consisting of Si, SiGe, SiGeC, SiC, Ge, GaAs, InP, and InAs. In one embodiment of the present invention, the wafer is a III/V compound semiconductor wafer. In an embodiment of the present invention, the wafer is a silicon wafer. In an embodiment of the present invention, the substrate is a ceramic substrate. In an embodiment of the present invention, the substrate is a glass substrate. Glass substrates may be useful, e.g., in the manufacture of flat panel displays and liquid crystal display panels. In an embodiment of the present invention, the substrate is a plastic substrate. In an embodiment of the present invention, the substrate is transparent (for the naked human eye). In an embodiment of the present invention, the substrate is colored. In an embodiment of the present invention, the substrate is absent a color.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system may image the pattern on the array of individually controllable elements such that the pattern is coherently formed on the substrate; alternatively, the projection system may image secondary sources for which the elements of the array of individually controllable elements act as shutters. In this respect, the projection system may comprise an array of focusing elements such as a micro lens array (known as an MLA) or a Fresnel lens array, e.g. to form the secondary sources and to image spots onto the substrate. In an embodiment of the present invention, the array of focusing elements (e.g., MLA) comprises at least 10 focus elements, e.g. at least 100 focus elements, at least 1000 focus elements, at least 10000 focus elements, at least 100000 focus elements, or at least 1000000 focus elements. In an embodiment of the present invention, the number of individually controllable elements in the patterning device is equal to or greater than the number of focusing elements in the array of focusing elements. In an embodiment of the present invention, the array of focusing elements comprises a focusing element that is optically associated with one or more of the individually controllable elements in the array of individually controllable elements, e.g. with 2 or more of the individually controllable elements in the array of individually controllable elements, such as 3 or more, 5 or more, 10 or more, 20 or more, 25 or more, 35 or more, or 50 or more. In an embodiment of the present invention, the array of focusing elements comprises more than one focusing element (e.g. more than 1000, the majority, or about all) that is optically associated with one or more of the individually controllable elements in the array of individually controllable elements. In an embodiment of the present invention, the MLA is movable (e.g. with the use of actuators) at least in the direction to and away from the substrate, e.g. with the use of one or more actuators. Being able to move the MLA to and away from the substrate allows, e.g., for focus adjustment without having to move the substrate.

As here depicted, the apparatus is of a reflective type (e.g. employing a reflective array of individually controllable elements). Alternatively, the apparatus may be of a transmissive type (e.g. employing a transmissive array of individually controllable elements).

The lithographic apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by an "immersion liquid" having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. In embodiment of the present invention, the radiation source provides radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In embodiments of the present invention, the radiation provided by radiation source SO has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In embodiments of the present invention, the radiation has a wavelength including 436 nm, 405 nm, 365 nm, 355 nm, 248 nm, 193 nm, 157 nm, and/or 126 nm. In an embodiment of the present invention, the radiation includes a wavelength of around 365 nm or around 355 nm. In an embodiment of the present invention, the radiation includes a broad band of wavelengths, for example encompassing 365, 405 and 436 nm. A 355 nm laser source could be used. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system. If the patterning device is a light source itself, e.g. a laser diode array or a light emitting diode array, the apparatus may be designed without an illumination system or at least a simplified illumination system (e.g., the need for radiation source SO may be obviated).

The illuminator IL, may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross-section. The illuminator IL, or an additional component associated with it, may also be arranged to divide the radiation beam into a plurality of sub-beams that may, for example, each be associated with one or a plurality of the individually controllable elements of the array of individually controllable elements. A two-dimensional diffraction grating may, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g. an interferometric device, linear encoder or capacitive sensor), the substrate table WT can be moved accurately, e.g. so as to position different target portions C in the path of the radiation beam B. Where used, the positioning means for the array of individually controllable elements can be used to correct accurately the position of the patterning device PD with respect to the path of the beam B, e.g. during a scan. In an embodiment of the present invention, movement of the substrate table WT is realized with the aid of a long-stroke module (course positioning) and a short-stroke module (fine positioning), which are not explicitly depicted in FIG. 1. In an embodiment of the present invention, the apparatus is absent at least a short stroke module for moving substrate table WT. A similar system may also be used to position the array of individually controllable elements. It will be appreciated that the projection beam B may alternatively/additionally be moveable while the object table and/or the array of individually controllable elements may have a fixed position to provide the required relative movement. Such an arrangement may assist in limiting the size of the apparatus. As a further alternative, which may e.g. be applicable in the manufacture of flat panel displays, the position of the substrate table WT and the projection system PS may be fixed and the substrate W may be arranged to be moved relative to the substrate table WT. For example, the substrate table WT may be provided with a system for scanning the substrate W across it at a substantially constant velocity.

As shown in FIG. 1, the beam of radiation B may be directed to the patterning device PD by means of a beam splitter BS configured such that the radiation is initially reflected by the beam splitter and directed to the patterning device PD. It should be realized that the beam of radiation B may also be directed at the patterning device without the use of a beam splitter. In an embodiment of the present invention, the beam of radiation is directed at the patterning device at an angle between 0 and 90°, e.g. between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements may be used to direct the beam of radiation B to the patterning device PD and subsequently to the projection system PS. In particular, an arrangement such as is shown in FIG. 1 may not be required if a transmissive patterning device is used.

The depicted apparatus can be used in four preferred modes:

1. In step mode, the array of individually controllable elements and the substrate are kept essentially stationary, while an entire pattern imparted to the radiation beam is projected onto a target portion C at one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e. a single dynamic exposure). The velocity and direction of the substrate relative to the array of individually controllable elements may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements may be used.

Combinations and/or variations on the above described modes of use or entirely different modes of use may also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern may be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling".

Grayscaling provides greater control of the position of the pattern feature boundaries than is possible in a lithography system in which the radiation intensity provided to the substrate by a given individually controllable element can only be set to two values (namely just a maximum value and a minimum value). In embodiments of the present invention, at least three different radiation intensity values can be projected onto the substrate, eg. at least 4 radiation intensity values, at least 8 radiation intensity values, at least 16 radiation intensity values, at least 32 radiation intensity values, at least 64 radiation intensity values, at least 128 radiation intensity values or at least 256 radiation intensity values.

It should be appreciated that grayscaling may be used for additional or alternative purposes to that described above. For example, the processing of the substrate after the exposure may be tuned such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling may be used to provide a radiation dose profile across the substrate having more than two desired dose levels. In embodiment, the radiation dose profile has at least 2 desired dose levels, e.g. at least 3 desired radiation dose levels, at least 4 desired radiation dose levels, at least 6 desired radiation dose levels or at least 8 desired radiation dose levels.

It should further be appreciated that the radiation dose profile may be controlled by methods other than by merely controlling the intensity of the radiation received at each point on the substrate, as described above. For example, the radiation dose received by each point on the substrate may alternatively or additionally be controlled by controlling the duration of the exposure of said point. As a further example, each point on the substrate may potentially receive radiation in a plurality of successive exposures. The radiation dose received by each point may, therefore, be alternatively or additionally controlled by exposing said point using a selected subset of said plurality of successive exposures.

In order to form the required pattern on the substrate, it is necessary to set each of the individually controllable elements in the patterning device to the requisite state at each stage during the exposure process. Therefore control signals, representing the requisite states, must be transmitted to each of the individually controllable elements. Preferably, the lithographic apparatus includes a controller that generates the control signals. The pattern to be formed on the substrate may be provided to the lithographic apparatus in a vector-defined format such as GDSII. In order to convert the design information into the control signals for each individually controllable element, the controller includes one or more data manipulation devices, each configured to perform a processing step on a data stream that represents the pattern. The data manipulation devices may collectively be referred to as the "datapath".

The data manipulation devices of the datapath may be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

Figure 2:
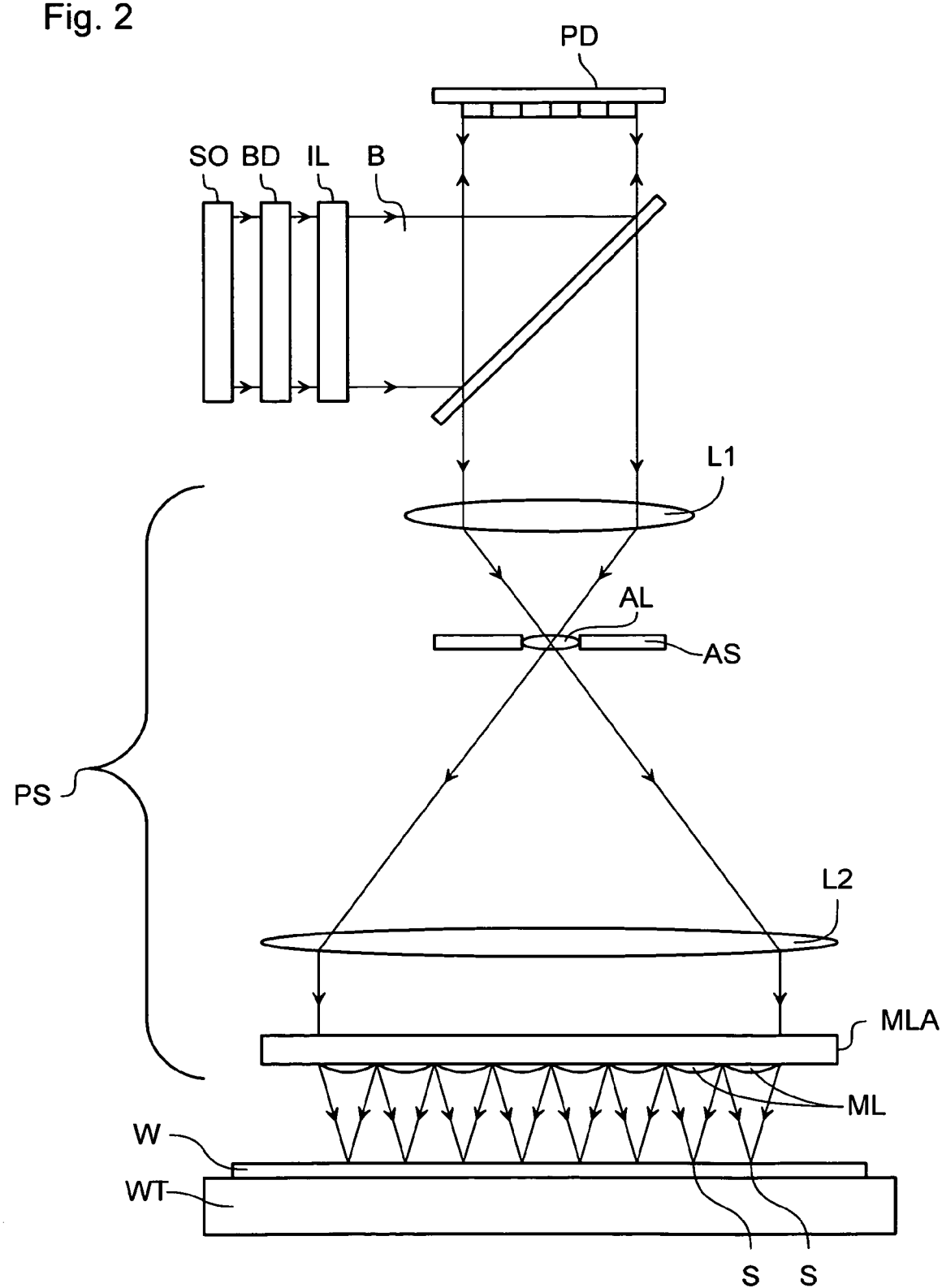
FIG. 2 depicts a lithographic apparatus according to another embodiment of the present invention.

FIG. 2 depicts an arrangement of the apparatus according to the present invention that may be used, e.g., in the manufacture of flat panel displays. Components corresponding to those shown in FIG. 1 are depicted with the same reference numerals. Also, the above descriptions of the various embodiments, e.g. the various configurations of the substrate, the contrast device, the MLA, the beam of radiation, etc., remain applicable.

As shown in FIG. 2 the projection system PS includes a beam expander, which comprises two lenses L1, L2. The first lens L1 is arranged to receive the modulated radiation beam B and focus it through an aperture in an aperture stop AS. A further lens AL may be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens ML focuses the respective portion of the modulated radiation beam B to a point that lies on the substrate W. In this way an array of radiation spots S is exposed onto the substrate W. It will be appreciated that, although only eight lenses ML of the illustrated array of lenses MLA are shown, the array of lenses may comprise many thousands of lenses (the same is true of the array of individually controllable elements used as the patterning device PD).

Figure 3:
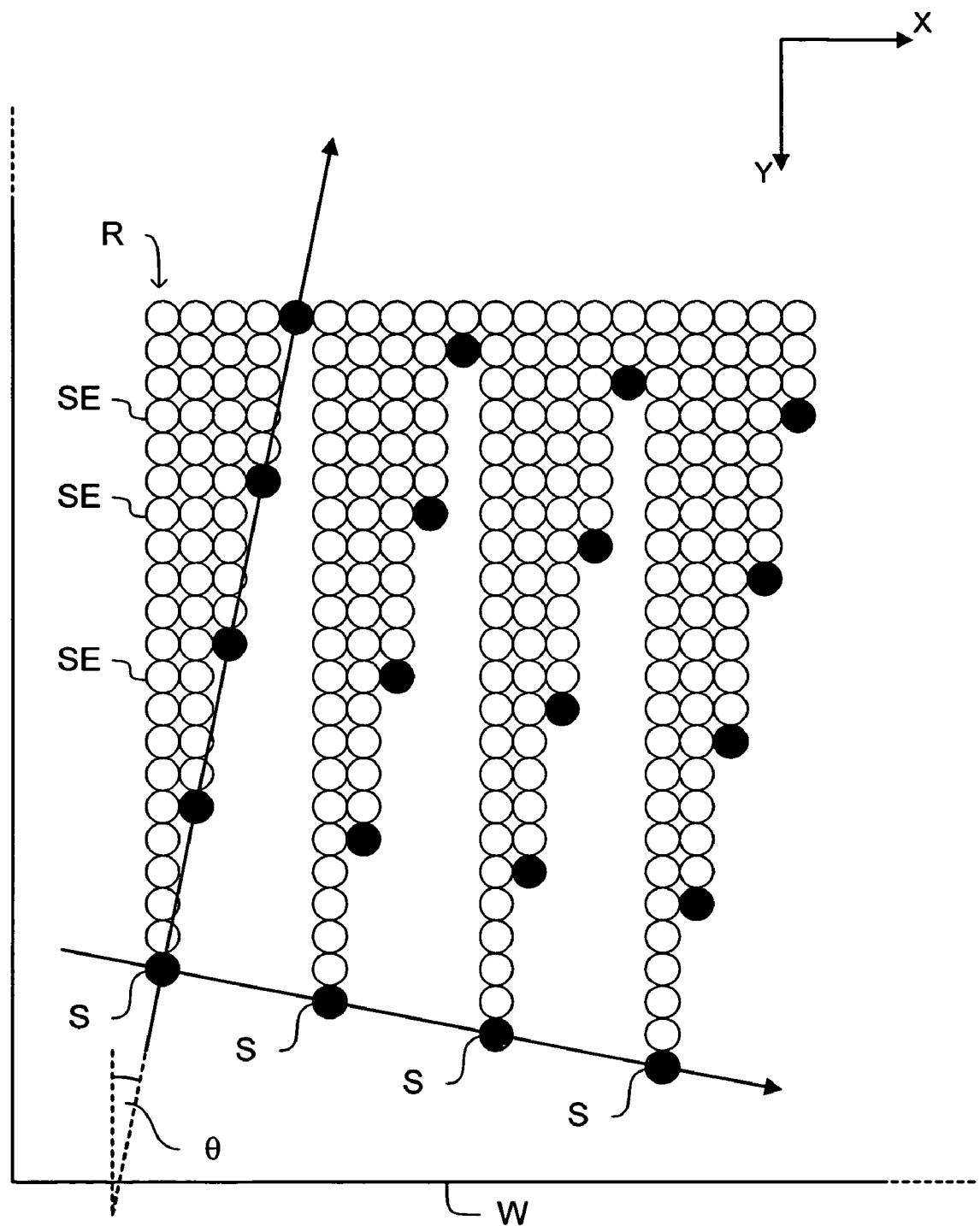
FIG. 3 depicts a mode of transferring a pattern to a substrate using an embodiment of the invention as show in FIG. 2.

FIG. 3 illustrates schematically how the pattern on the substrate W may be generated. The filled in circles represent the array of spots S projected onto the substrate by the array of lenses MLA in the projection system PS. The substrate is moved relative to the projection system in the Y direction as a series of exposures are exposed on the substrate. The open circles represent spot exposures SE that have previously been exposed on the substrate. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging."

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots S. In embodiments of the present invention, the angle θ is at most 20°, 10°, for instance at most 5°, at most 3°, at most 1°, at most 0.5°, at most 0.25°, at most 0.10°, at most 0.05°, or at most 0.01°. In an embodiment of the present invention, the angle θ is at least 0.0001°.

Figure 4:
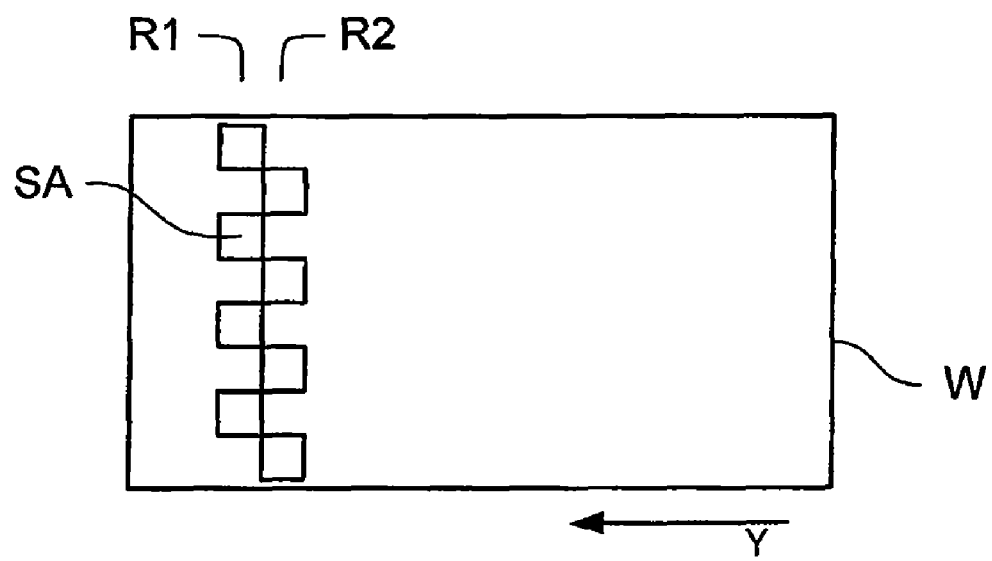
FIG. 4 depicts an arrangement of optical engines.

FIG. 4 shows schematically how the entire flat panel display substrate W may be exposed in a single scan, by using a plurality of optical engines. Eight arrays SA of radiation spots S are produced by eight optical engines (not shown), arranged in two rows R1, R2 in a 'chess board' configuration such that the edge of one array of radiation spots S slightly overlaps (in the scanning direction Y) with the edge of the adjacent array of radiation spots S. In embodiments of the present invention, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines may be used. In an embodiment of the present invention, the number of optical engines is at least 1, for instance at least 2, at least 4, at least 8, at least 10, at least 12, at least 14, or at least 17. In an embodiment of the present invention, the number of optical engines is less than 40, e.g. less than 30 or less than 20.

Each optical engine may comprise a separate illumination system IL, patterning device PD and projection system PS as described above. It is to be appreciated, however, that two or more optical engines may share at least a part of one or more of the illumination system, patterning device and projection system.

Figure 5:
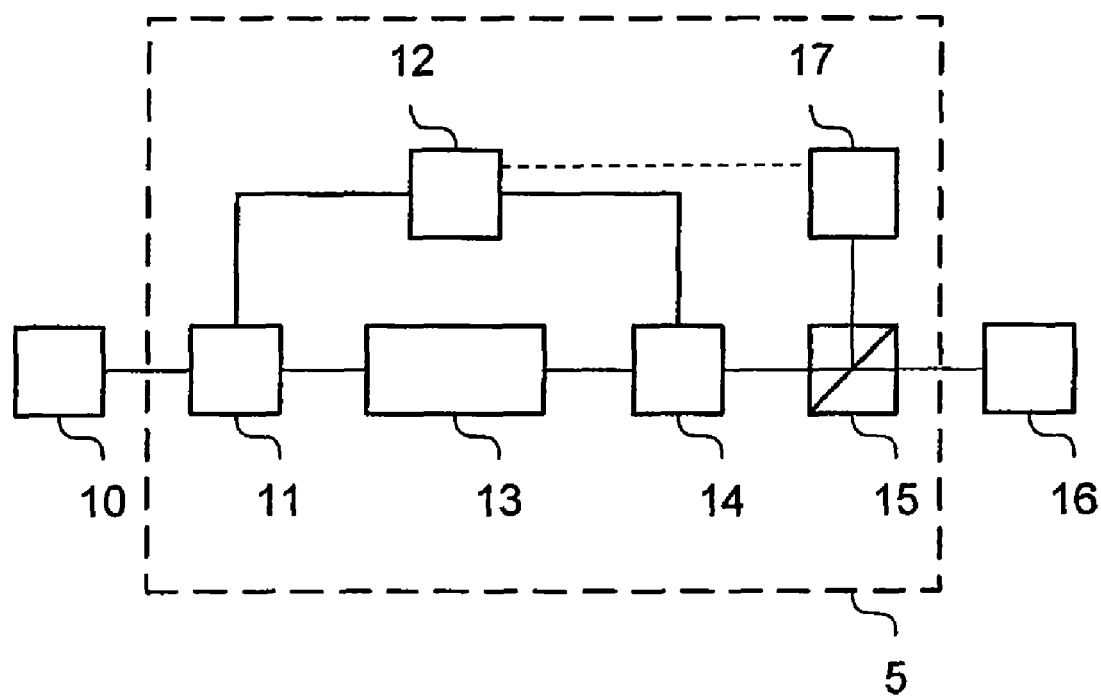
FIG. 5 depicts an arrangement for controlling the radiation dose within a pulse of radiation.

FIG. 5 depicts a radiation dose control system 5, by which the radiation dose within a pulse of radiation may be controlled, that may be used in embodiments of the present invention. A pulse of radiation is provided from a radiation pulse emitter 10 to the radiation dose control system 5. The radiation pulse emitter 10 may be, for example a radiation source SO or an illuminator IL for conditioning the beam of radiation. Alternatively, as described below, the radiation dose control system 5 for controlling the dose within a pulse of radiation may, according to the present invention, be arranged at another location within the beam path of the radiation within a lithographic apparatus.

The intensity of the radiation in the pulse may be detected by a radiation intensity sensor 11. In order to determine the radiation dose within a pulse from the measurements of the radiation intensity sensor, the radiation intensity sensor 11 may be configured to continuously monitor the intensity of the radiation throughout the duration of the pulse such that the total radiation dose can be precisely determined. Alternatively, for example, the radiation intensity sensor may be configured to measure a characteristic feature of the radiation pulse from which the total radiation dose may be determined. This may provide sufficient accuracy in the determination of the radiation dose if, for example, the shape of the radiation intensity profile of the pulse is consistent for a given radiation dose. For example, it may be possible to determine the radiation dose from the peak radiation intensity within the pulse or from the total time within a pulse that the radiation intensity is above a given threshold. A pulse controller (pulse modulator) 12 may determine the radiation dose within a pulse from the measured characteristic determined by the radiation intensity detector 11 by, for example, a pre-set algorithm or by using look-up tables previously established by calibration.

Alternatively or additionally a radiation dose sensor that directly measures the radiation dose in all or part of a pulse of radiation may be used, providing the measurement of the radiation dose to the pulse controller 12. For example, an HV vacuumdiode may be used to directly measure the radiation dose.

The pulse controller 12 further determines the extent to which the radiation dose within the pulse exceeds a desired radiation dose and controls the remainder of the radiation dose control system 5 to remove a portion of the radiation dose, e.g., optionally directing the removed portion of radiation to radiation sink 17, within the pulse such that the remaining dose within the pulse is the required radiation dose.

In order to provide sufficient time for the pulse controller 12 to make the determinations discussed above and set the remainder of the radiation dose control system 5 as necessary in order to reduce the radiation dose within the pulse, an optical delay line 13 is provided which delays the transmission of the pulse of radiation to the remainder of the radiation dose control system 5.

The optical delay line 13 may be formed, for example, from an elongate optical component, such as a fiber optic cable, or may be a pair of parallel reflectors constructed such that the pulse of radiation is incident on a first one of the planar reflectors and is reflected backwards and forwards between the planar reflectors a large number of times before exiting the space between the planar reflectors. By controlling the length of the optical component or the number of reflections between the planar reflectors, respectively, it is possible to control the duration of the delay provided by the optical delay line 13. It should be appreciated that the present invention is not limited to the use of a particular optical delay line and that any suitable optical delay line or combination with a pulse stretcher may be used.

After the radiation pulse has passed through the optical delay line 13, it is directed to a system that removes a portion of the radiation dose from the radiation pulse under the control of the pulse controller 12. As depicted in FIG. 5, this may be provided by a pockels cell 14 and a polarizing filter. The pockels cell 14 contains an electro-optical material that rotates the orientation of linearly polarized radiation by an amount dependent on the voltage applied to the electro-optical material by the pulse controller 12. The polarizing filter, in this case a polarizing beam splitter 15, filters radiation from the pulse, depending on the orientation of the linearly polarized radiation. Accordingly, for example, the greater the rotation of the linearly polarized radiation by the pockels cell 14, the more radiation is filtered from the pulse by the polarizing filter 15. Alternatively, the system may be configured in the opposite sense, namely such that the greater the rotation of the orientation of the linearly polarized radiation by the pockels cell 14, the less the radiation is filtered by the polarizing filter 15.

In order to maximize the control available by means of the pockels cell 14 and the polarizing filter 15, the radiation entering the pockels cell 14 is preferably linearly polarized according to a given orientation. Accordingly, the radiation provided by the pulsed emitter 10 may be linearly polarized according to the requisite orientation. Alternatively or additionally, a linear polarizer may be provided at a convenient location in the beam path between the radiation pulse emitter 10 and the pockels cell 14. If a linear polarizer is used and is arranged between the radiation intensity detector 11 and the pockels cell 14, this may affect the radiation dose of a pulse between the determination of the radiation dose by the radiation intensity detector 11 and the adjustment of the radiation dose by the pockels cell 14 and the polarizing filter 15. Likewise, the optical delay line 13 may affect the radiation dose. Accordingly, the pulse controller 12 may be calibrated to take account of the effects on the radiation dose of the pulse caused by the linear polarizer and the optical delay line 13.

As depicted in FIG. 5, radiation not filtered from the pulse by the polarizing filter 15 is transmitted to the remainder 16 of the apparatus, for example to one or more arrays of individually controllable elements. As depicted in FIG. 5, where a polarizing beam splitter is used as the polarizing filter 15, the radiation filtered from the pulse of radiation may be directed to a radiation sink 17 that absorbs the radiation, preventing stray radiation from being transmitted to the remainder 16 of the apparatus, causing further dose errors. The radiation sink 17 may be cooled in order to prevent heating of the radiation sink causing thermal distortion in the remainder of the apparatus.

Figure 6A:
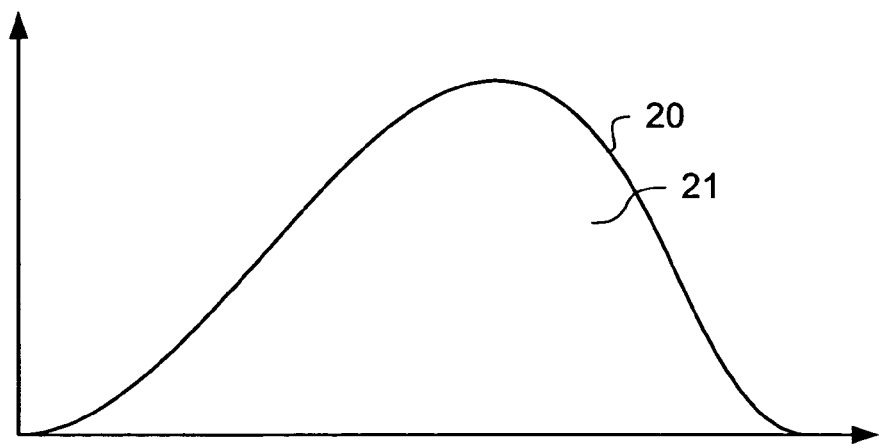
FIGS. 6a, 6b and 6c explain how the radiation dose within a pulse of radiation may be controlled.

FIG. 6a depicts a typical radiation intensity profile of a pulse of radiation over time. As shown, the vertical axis represents the radiation intensity measured at a given location as a radiation pulse passes and the horizontal axis represents the time elapsed. The radiation dose of the pulse is proportional to the area 21 under the radiation intensity curve 20.

Figure 6B:
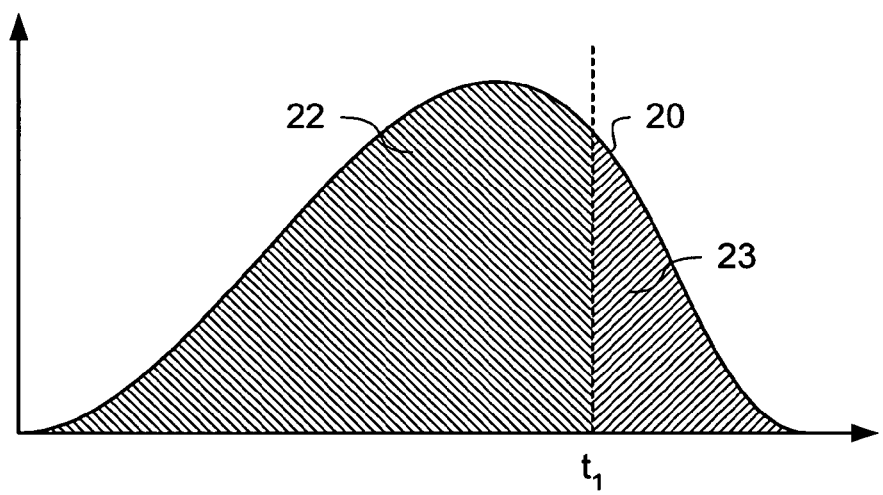

In order to reduce the radiation dose of a pulse, the pulse controller 12 may permit substantially all of the radiation intensity to pass to the remainder 16 of the apparatus for a first period of time and, for the remainder of the pulse, allow substantially no radiation to pass to the remainder of the system. Accordingly, by adjusting the length of the first period of time, the radiation dose of the pulse transmitted to the remainder 16 of the apparatus can be adjusted. For example, as depicted in FIG. 6b, the pulse controller 12 may transmit substantially all of the radiation intensity of the pulse up to a time $t_1$ to pass through the remainder 16 of the apparatus and, after that, transmit no radiation to the remainder 16 of the apparatus. Accordingly, the radiation dose of the pulse, corresponding to the area 22 under the radiation intensity curve 20 up to the time $t_1$ is transmitted to the remainder 16 of the apparatus and the radiation dose corresponding to the area 23 under the radiation intensity curve 20 but after the time $t_1$ is filtered out and, for example, directed to the radiation sink 17. It should be appreciated that this arrangement may be inverted, the pulse controller 12 filtering out radiation from the radiation pulse up to a given time and thereafter transmitting the radiation to the remainder 16 of the apparatus. However, in such an arrangement, a longer optical delay line would be required.

Figure 6C:
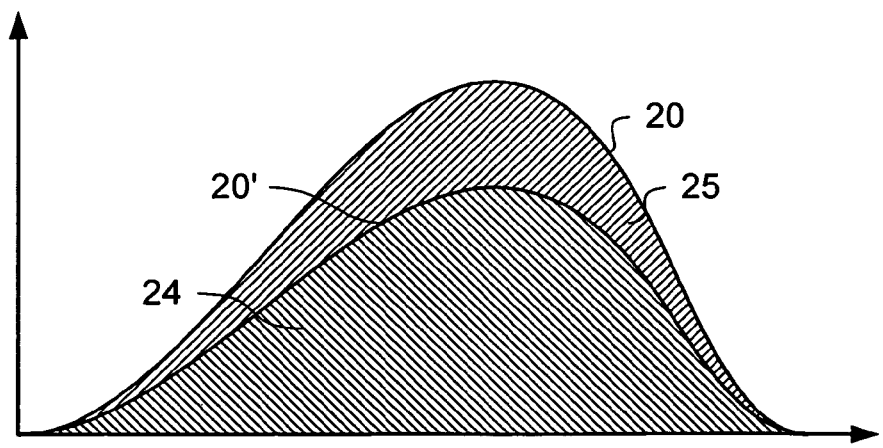

FIG. 6c depicts a further alternative arrangement. In this case, the pulse controller 12 may be arranged to filter out a given proportion of the radiation intensity of the pulse for the duration of the pulse. Accordingly, by adjusting the proportion of the pulse that is filtered out, the total radiation dose of the pulse can be adjusted. For example, as depicted in FIG. 6c, by filtering out a given proportion of the radiation intensity, the radiation intensity curve 20 of the pulse may be reduced to a modified radiation intensity curve 20'. Accordingly, the radiation dose corresponding to the area 24 under the modified radiation intensity curve 20' is transmitted to the remainder 16 of the apparatus and the radiation dose corresponding to the area 25 between the original radiation intensity curve 20 and the modified radiation intensity curve 20' is filtered out and, for example, transmitted to the radiation sink 17.

It should be appreciated that a combination of the measures discussed above may be used. For example, the pulse controller 12 may reduce the intensity of the pulse by a given proportion for a given amount of time and for the remainder of the pulse transmit substantially no radiation to the remainder 16 of the apparatus. Likewise, the pulse controller 12 may divide the duration of the pulse into a plurality of time intervals and reduce the intensity of the radiation in the pulse during those time intervals by independently controlled proportions for each time interval. The control of the proportion of the intensity of the radiation transmitted to the remainder 16 of the apparatus may be continuously controlled during one or more of such time intervals or over the entire duration of the pulse.

Furthermore, although the present invention is discussed in relation to using the combination of a pockels cell and a polarizing filter in order to adjust the radiation dose, any convenient system for adjusting the dose of a pulse of radiation may be used. For example, a mechanical shutter, acousto-optical modulator (AOM) or aperture control may also be used.

Embodiment 1

Figure 7:
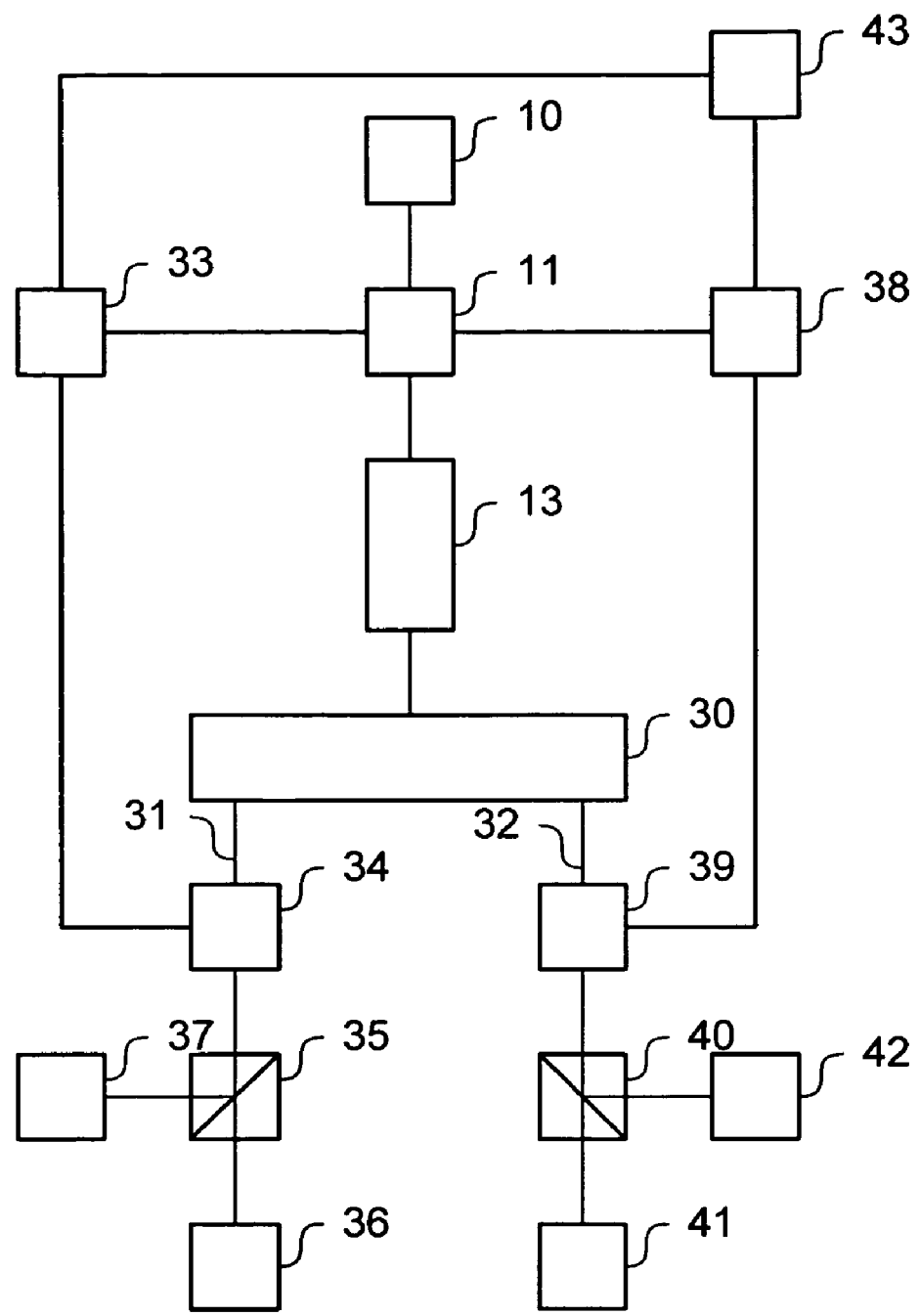
FIG. 7 depicts a first embodiment of the present invention.

FIG. 7 depicts a system arranged according to a first embodiment of the present invention. As depicted, the system includes a radiation pulse emitter 10, a radiation intensity detector 11 and an optical delay line 13 in a similar arrangement to that discussed above. The system further includes a radiation beam divider 30 that divides the radiation from the optical delay line 13 into two separate radiation beam paths 31,32. Accordingly, each pulse of radiation emitted by the radiation pulse emitter 10 is divided into two simultaneous pulses, following the first and second radiation beam paths 31,32 respectively. Associated with the first radiation beam path 31 are a first pulse controller (pulse modulator) 33, a first pockels cell 34 and a first polarizing filter 35. Accordingly, in the same manner as discussed above with respect to FIGS. 5 and 6a-c, the radiation dose of a pulse in the first radiation beam path 31 can be adjusted, based on the radiation intensity detected by the radiation intensity sensor 11 such that a desired radiation dose can be transmitted to an array of individually controllable elements 36 that modulate the pulse of radiation. As above, a radiation sink 37 may be provided to absorb the radiation filtered from the pulse.

In a similar fashion, a second pulse controller 38, a second pockels cell 39 and a second polarizing filter 40 are provided to adjust the radiation dose of a pulse of radiation in the second radiation beam path 32. The radiation dose-adjusted pulse in the second radiation beam path 32 may then be modulated by a second array of individually controllable elements 41. A second radiation sink 42 may be provided in order to absorb the radiation filtered from the radiation pulse in the second radiation beam path 32. Alternatively, a common radiation sink may be used for radiation filtered from both radiation beam paths.

By dividing the pulsed beam of radiation before adjusting the dose of the pulses of radiation, the dose adjusted by each system for adjusting the radiation dose in a pulse of radiation is reduced. Accordingly the overall energy in each of the pulses emitted by the radiation pulse emitter 10 may be larger without exceeding the maximum dose that may be controlled by each system for adjusting the radiation dose of a pulse of radiation.

The system may be configured such that the first and second pulse controllers 33,38 control the first and second pockels cell 34,39 respectively such that the radiation dose of pulses exiting the first and second polarizing filters 35,40 are substantially the same. For example, the pulse controllers 33,38 may compensate, therefore, for any imperfection in the division of the radiation dose between the first and second radiation beam path 31,32 by the radiation beam divider 30. Alternatively or additionally, the pulse controllers 33,38 may be configured such that pulses having different radiation doses may be produced from each of the first and second radiation beam paths 31,32. Accordingly, a dose controller 43 may be provided that sets the first and second pulse controllers 33,38 to set the radiation doses of the pulses to the required levels.

Accordingly, the system may provide independent radiation dose control for the first and second arrays of individually controllable elements 36,41. Such an arrangement may be beneficial, for example, if different patterns are to be projected onto a substrate by beams of radiation modulated by the first and second arrays of individually controllable elements 36,41 and/or in order to compensation for variations in subsequent components in the first and second radiation beam paths 31,32, such as different projection systems associated with each of the first and second arrays of individually controllable elements 36,41. It should be appreciated that although FIG. 7 has been depicted with separate first and second pulse controllers 33,38 and a separate dose controller 43, any or all of these controllers may be combined in a single control system.

It should further be appreciated that although in the arrangement depicted in FIG. 7, the beam divider 30 divides the pulses of radiation emitted from the radiation pulse emitter 10 into first and second radiation beam paths 31,32, the radiation beam divider 30 may divide the pulses into any number of radiation beam paths, each of which may be provided with an associated pulse controller, pockels cell and polarizing filter.

Furthermore, although the present invention is described in relation to use with a lithographic apparatus and the division of pulses of radiation from a radiation pulse emitter to illuminate a plurality of arrays of individually controllable elements, the present invention may be applied to any situation in which a pulsed beam of radiation is to be divided into a plurality of pulsed sub-beams of radiation having controlled doses of radiation in the pulses.

Embodiment 2

Figure 8:
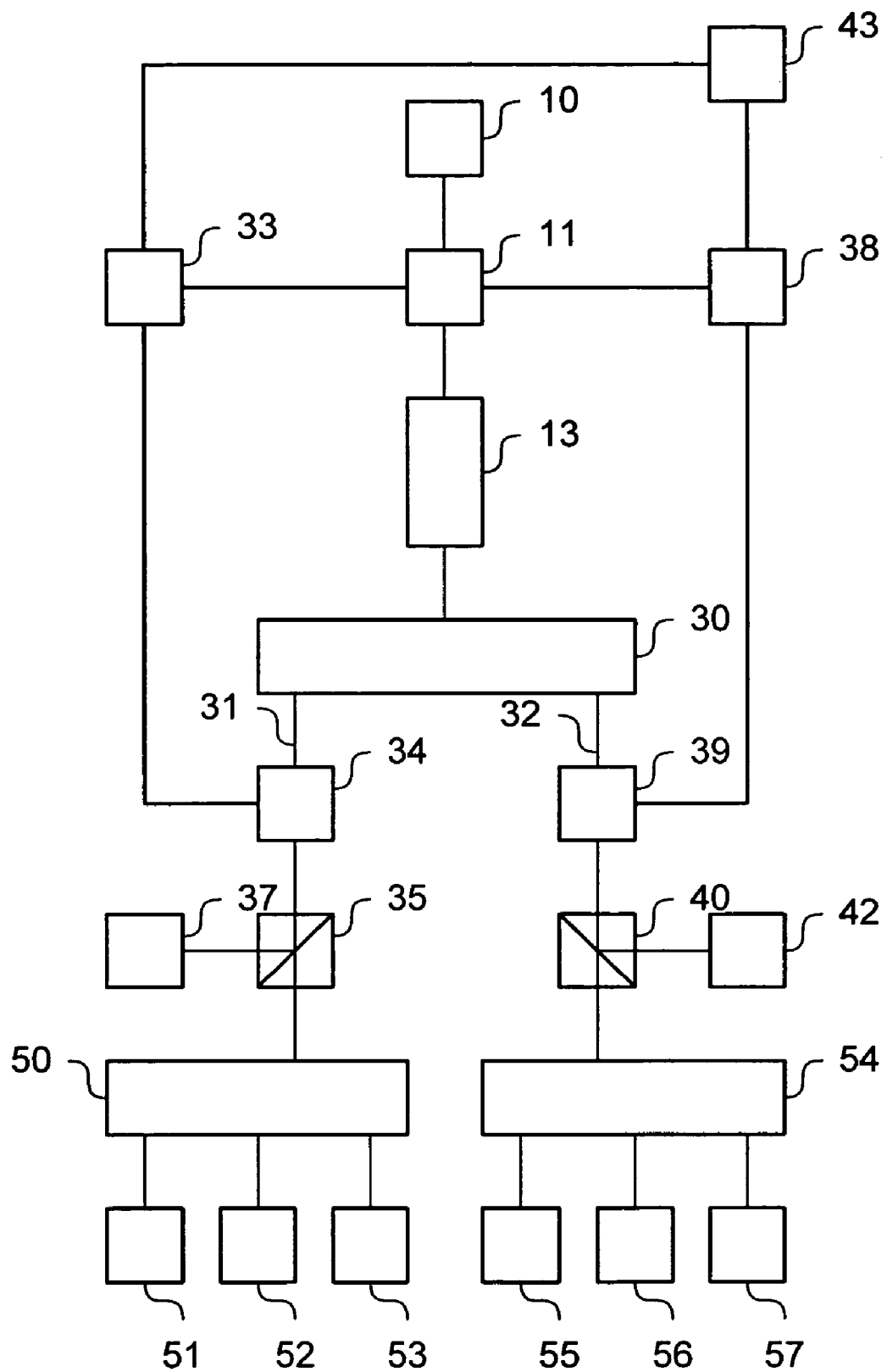
FIG. 8 depicts a second embodiment of the present invention.

FIG. 8 depicts a system arranged according to a second embodiment of the present invention. Much of the second embodiment is similar to the first embodiment and only the differences thereof will be described. Furthermore, variations discussed above in relation to the first embodiment apply equally to the second embodiment.

As depicted, the basic configuration of the second embodiment is the same as the first embodiment. However, in place of the first array of individually controllable elements 36, the first radiation beam path 31 has a second radiation beam divider 50 that divides the pulses of radiation transmitted from the first polarizing filter 35 between three arrays of individually controllable elements 51,52,53. Likewise, the second radiation beam path 32, includes a third radiation beam divider 54 that divides pulses of radiation transmitted from the second polarizing filter 40 between three arrays of individually controllable elements 55,56,57.

Accordingly, each of the first and second pulse controllers 33,38 control the radiation dose of pulses modulated by a respective first and second set of arrays of individually controllable elements. Such an arrangement is simpler for a large number of arrays of individually controllable elements than an arrangement in which each array of individually controllable elements has its own associated pulse controller, pockels cell and polarizing filter (namely its own system for adjusting the dose of radiation in a pulse of radiation), whilst still dividing the total radiation energy of each pulse from the radiation pulse emitter between at least two systems for adjusting the dose of radiation in a pulse of radiation. As with the first embodiment, it should be appreciated that the first radiation beam divider 30 may divide the pulses of radiation emitted by the radiation pulse emitter 10 into more than two radiation beam paths and that the radiation dose of pulses within each such radiation beam path may be adjusted by a pulse controller and associated pockels cell and polarizing filter prior to the pulses being further divided between arrays of individually controllable elements.

Furthermore, it should be appreciated that pulses of radiation within each such radiation beam path may be divided between different numbers of individually controllable elements from the other such radiation beam paths and at least one such radiation beam path may not be further divided at all.

Embodiment 3

Figure 9:
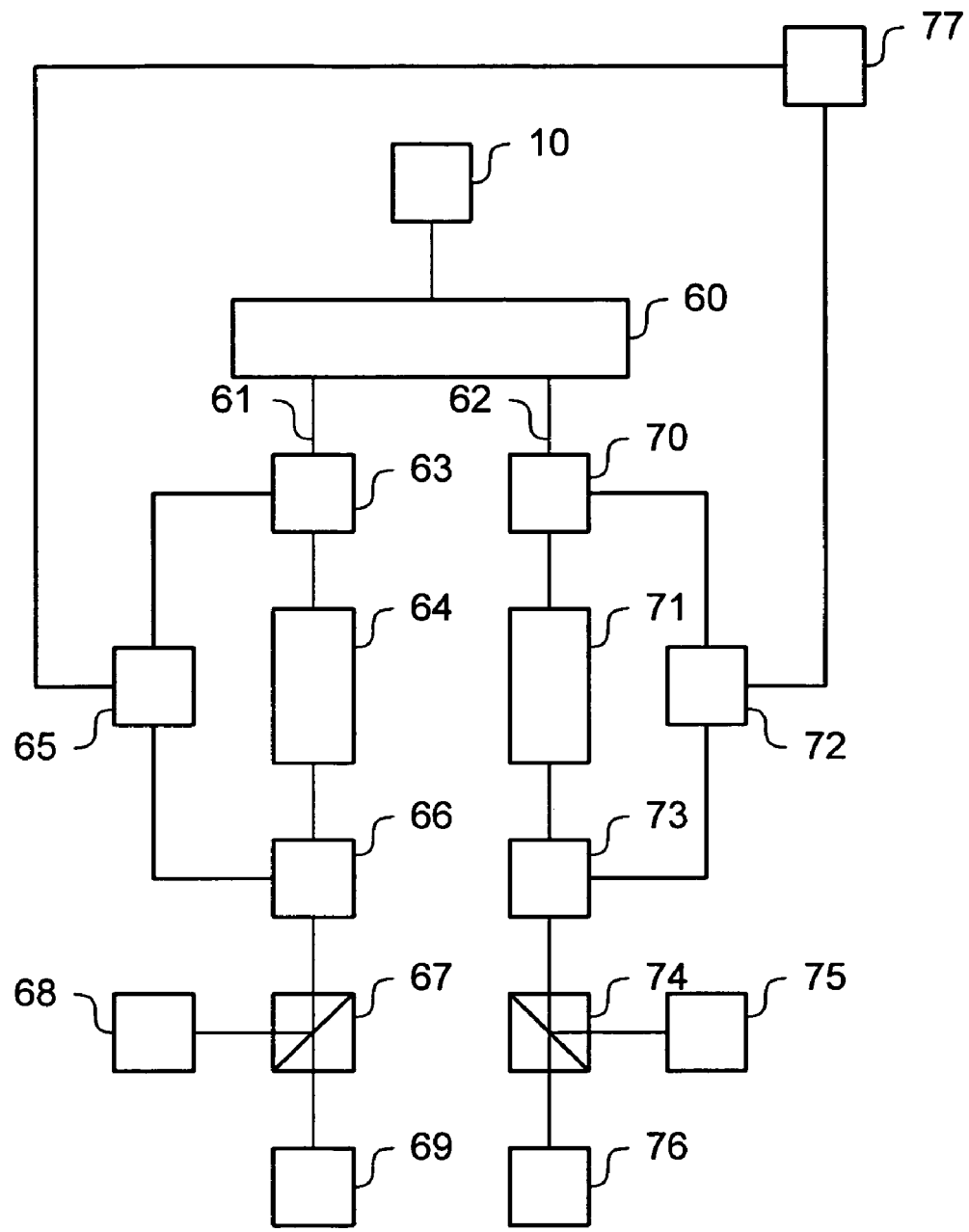
FIG. 9 depicts a third embodiment of the present invention.

FIG. 9 depicts a system arranged according to a third embodiment of the present invention. In this case, pulses of radiation emitted by a radiation pulse emitter 10 are divided by a radiation beam divider 60 between first and second radiation beam paths 61,62. The radiation dose of a pulse transmitted to the first radiation beam path 61 is detected by a first radiation intensity sensor 63, delayed in a first optical delay line 64, has its radiation dose adjusted under control of a first pulse controller 65 based on the measured dose determined from the measurement of the first radiation intensity sensor 63 by the combination of a first pockels cell 66 and a first polarizing filter 67. As before, the radiation filtered from the pulse may be absorbed by a first radiation sink 68 or by a common radiation sink. The radiation dose-adjusted pulse may than be modulated by a first array of individually controllable elements 69 or, in a manner corresponding to the second embodiment, be further divided for modulation by a plurality of arrays of individually controllable elements. Pulses of radiation following the second radiation beam path 62 are treated in a corresponding manner by a second radiation intensity detector 70, a second optical delay line 71, a second pulse controller 72, a second pockels cell 73, a second polarizing filter 74, a second radiation sink 75 (if required) and a second array of individually controllable elements 76 or, as with the first radiation beam path 61, further divided for modulation by a second plurality of arrays of individually controllable elements.

As with the first embodiment, a dose controller 77 may be provided to control the pulse controllers 65,72 such that required radiation dose corrections can be made to pulses of radiation in the first and second radiation beam paths 61,62. As with the first and second embodiments, the radiation beam divider may divide the pulses of radiation emitted by the radiation pulse emitter 10 between more than two radiation beam paths. In that case, each radiation beam path may be associated with its own radiation intensity sensor, optical delay line, pulse controller, pockels cell, polarizing filter, radiation sink (if required) and array of individually controllable elements or be further divided to provide radiation to a plurality of arrays of individually controllable elements.

Accordingly, it will be appreciated that the difference between the third embodiment and the first embodiment is that each radiation beam path has its own radiation intensity sensor and optical delay line. Accordingly, any inaccuracies and/or variations in the division of the radiation intensity between the optical beam paths by the radiation beam divider 60 will not reduce the accuracy of the control of the radiation dose of pulses within each of the radiation beam paths. Furthermore, by providing separate optical delay lines, different delays may be applied to pulses of radiation following different radiation beam paths (which may correspond to different arrays of individually controllable elements or different groups of arrays of individually controllable elements). Therefore, the timing of the exposure of images on the substrate, corresponding to the different arrays of individually controllable elements or groups of arrays of individually controllable elements, may be different. Such differences may be used, for example, to adjust the relative position of such images projected onto the substrate where, for example, the substrate scans relative to the projection system over the course of a plurality of pulses of the radiation system.

Embodiment 4

Figure 10:
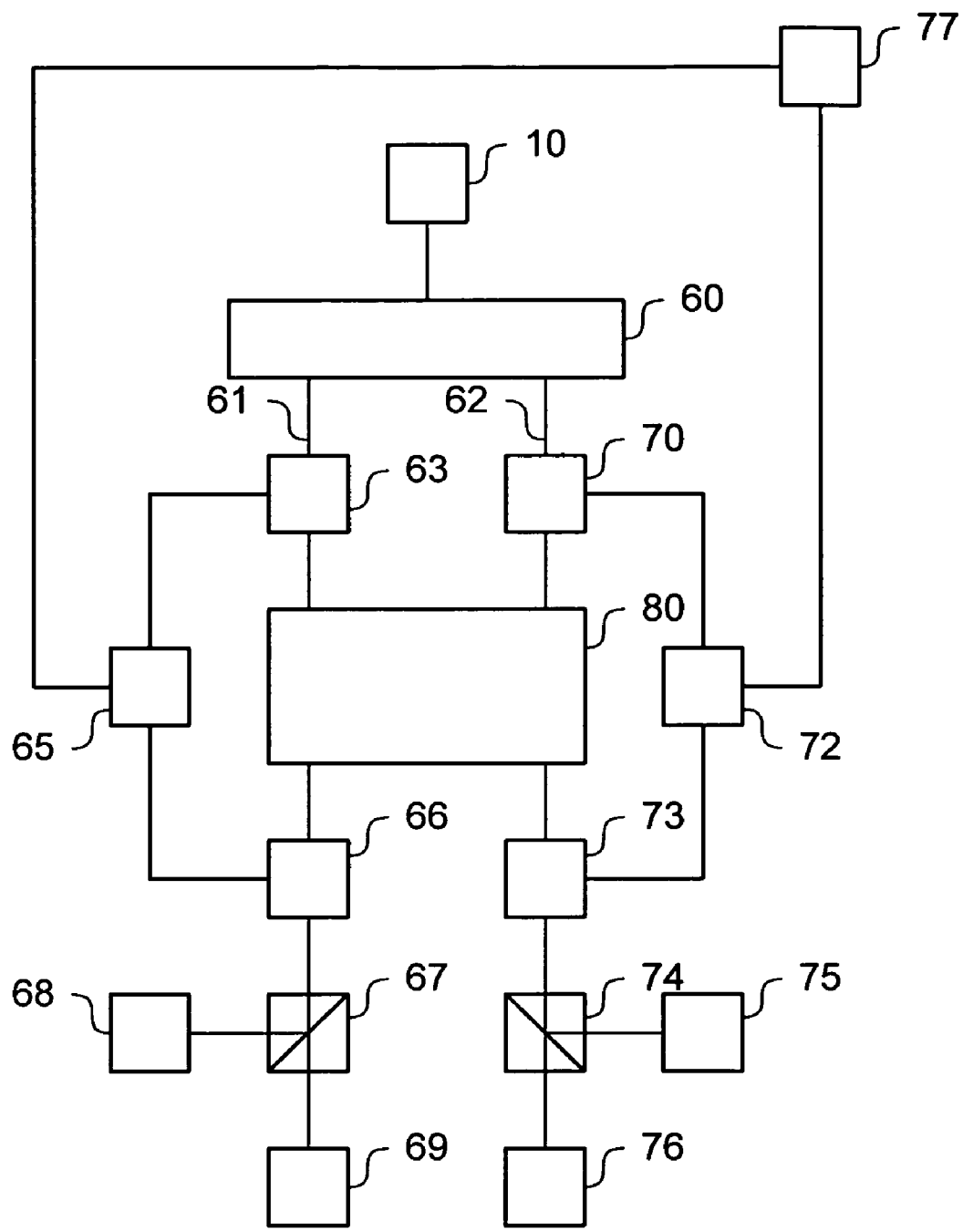
FIG. 10 depicts a fourth embodiment of the present invention.

FIG. 10 depicts a system arranged according to the fourth embodiment of the present invention. This embodiment is largely identical to the third embodiment and only the differences thereof will be described.

As depicted, the difference between the fourth embodiment and the third embodiment is that the first and second radiation beam paths 61,62 share a common optical delay line 80.

Figure 11A:
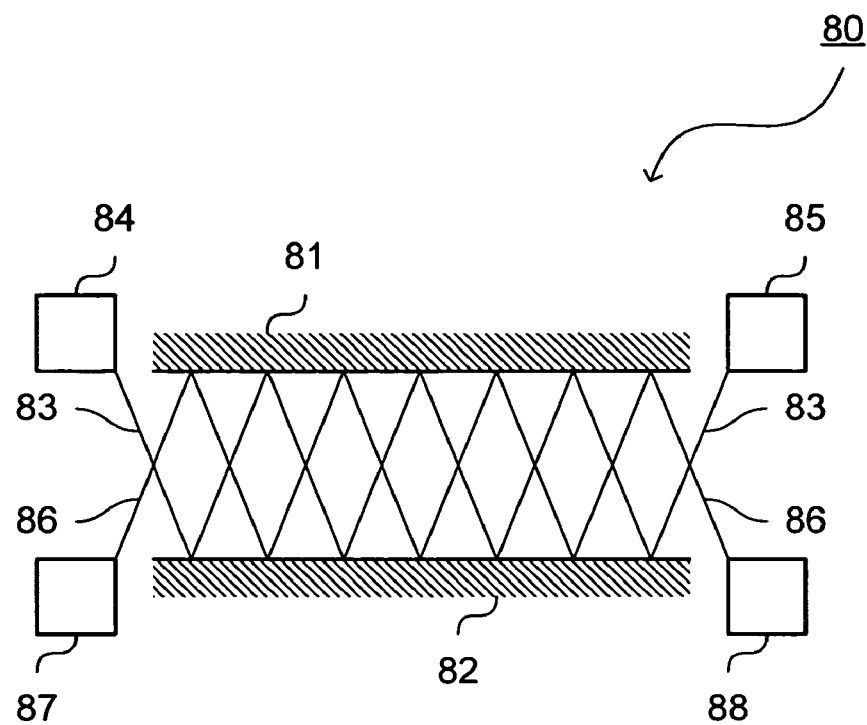
FIGS. 11a and 11b depict possible configurations of an optical delay line for use with the present invention.

FIG. 11a depicts an optical delay line 80 that may be shared by two or more radiation beam paths. As depicted, the optical delay line 80 comprises first and second parallel reflective surfaces 81,82. Radiation in a first optical beam path 83 is emitted from a first component 84 of the first radiation beam path 83 (which, in the configuration depicted in FIG. 10, may be the radiation intensity sensor 63) and is incident on the first reflective surface 81 at an oblique angle. The radiation subsequently is reflected backwards and forwards between the first reflective surface 81 and the second reflective surface 82 many times until it exits the optical delay line 80 and is directed to a second component 85 of the first radiation beam path 83 (which, in the configuration depicted in FIG. 10, may be first pockels cell 66).

In a corresponding manner, the radiation in the second radiation beam path 86 is directed from a first component 87 in the second radiation beam path 86 (which, in the case of the arrangement depicted in FIG. 10, may be the second radiation intensity detector 70) and is incident on the second reflective surface 82 at an oblique angle. The radiation in the second radiation beam path 86 subsequently is reflected backwards and forwards between the second reflective surface 82 and the first reflective surface 81 a plurality of times before exiting the optical delay line into a second component 88 of the second radiation beam path 86 (which, in the configuration depicted in FIG. 10, may be the second pockels cell 73). It should be appreciated that FIG. 11a is schematic and that in practice the first and second radiation beam paths 83,86 will be incident on the first and second reflective surfaces 81,82 respectively, at angles far closer to the perpendicular such that a greater number of reflections between the first and second reflective surfaces 81,82, and hence a greater delay of the pulse of radiation, will be provided for a given length of reflective surfaces 81,82.

Figure 11B:
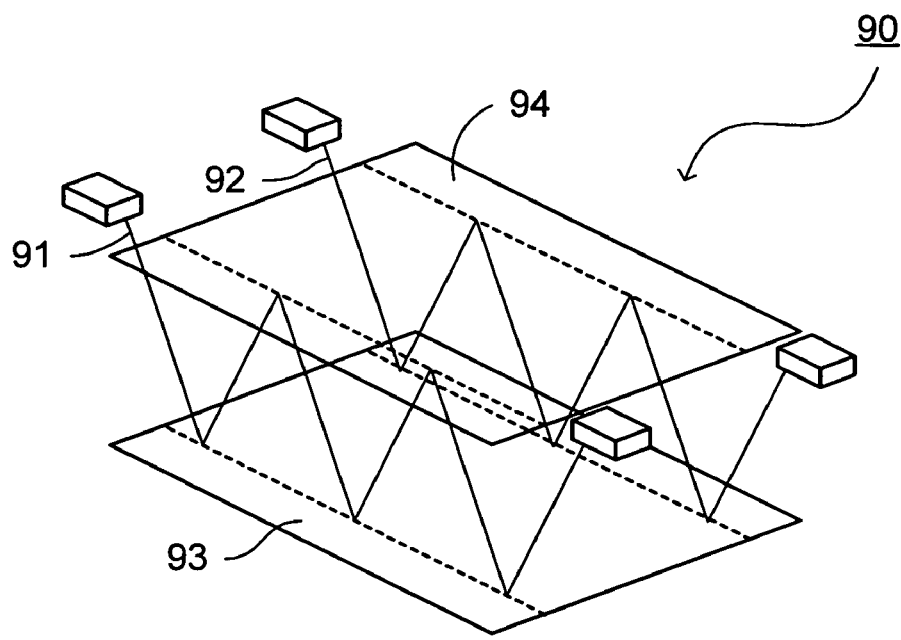

FIG. 11b depicts an alternative arrangement of an optical delay line 90, configured such that it can be shared by two or more radiation beam paths 91,92. This arrangement differs from that depicted in FIG. 11a in that both radiation beam paths are configured such that the radiation is initially incident on the first reflective surface 93 and subsequently reflects backwards and forwards between the first and second reflective surfaces 93,94 of the optical delay line 90. In this case, the first and second radiation beam paths 91,92 are spaced apart from each other in a direction perpendicular to the length of the optical delay line such that the first and second radiation beam paths 91,92 do not interfere.

It should be appreciated that more than two radiation beam paths may share an optical delay line configured as depicted in FIG. 11b. Furthermore, a greater number of radiation beam paths may share a single optical delay line by combining the arrangement depicted in FIGS. 11a and 11b.

The delay to a pulse introduced by an optical delay line according to either the arrangement depicted in FIG. 11a or the arrangement depicted in FIG. 11b may be adjusted by adjusting the separation between the first and second reflective surfaces and/or by adjusting the angle of incidence of the beam of radiation on the first of the reflective surfaces on which it is incident. It should be appreciated that the latter option may be used to adjust the delay independently for two radiation beam paths that share a common optical delay line. Adjustment of the delay, either for all radiation beam paths simultaneously or independently for each radiation beam path, may be used to tune the system with appropriate calibration. Alternatively or additionally, as discussed above, adjusting the delay introduced by the optical delay line may be used to adjust the position on the substrate at which images are projected where, for example, the substrate scans relative to the projection system over the course of a plurality of pulses of the radiation system.

Although the third and fourth embodiments have been described above in terms of each of the radiation beam paths following the radiation beam divider 60 having a radiation intensity sensor, it should be appreciated that the present invention is not limited to such an arrangement. In particular, if the division of the radiation intensity into the separate radiation beam paths by the radiation beam divider 60 is sufficiently constant and well known, it may be sufficient to provide a single radiation intensity sensor in one of the radiation beam paths. Based on the radiation dose measured in that radiation beam path, the radiation dose of the corresponding pulse in another radiation beam path may be determined.

It should be appreciated that, as discussed above, in relation to the first embodiment, the arrangements of the second, third and fourth embodiments are not limited to use in lithographic applications. Accordingly, the radiation dose-adjusted pulses of radiation may be provided to other components within a system in place of being modulated by arrays of individually controllable elements as discussed above.

Although specific reference may be made in this text to the use of lithographic apparatus in the manufacture of a specific device (e.g. an integrated circuit or a flat panel display), it should be understood that the lithographic apparatus described herein may have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus may be used to assist in the creation of a variety of layers, e.g. a thin film transistor layer and/or a color filter layer.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Having described specific embodiments of the present invention, it will be understood that many modifications thereof will readily appear or may be suggested to those skilled in the art, and it is intended therefore that this invention is limited only by the spirit and scope of the following claims.

The invention claimed is:

1. A lithographic apparatus, comprising:
   a radiation beam divider configured to divide a pulsed beam of radiation into at least first and second pulsed sub-beams of radiation;
   at least one sensor, configured to determine a radiation dose of a pulse of radiation in the pulsed beam of radiation or at least one of the pulsed first and second sub-beams of radiation;
   an optical delay component, configured to delay a pulse of radiation after the radiation dose of the pulse of radiation has been determined by said at least one sensor;
   a first modulator, configured to adjust a radiation dose of a pulse of radiation in said first pulsed sub-beam of radiation based on the radiation dose determined by the at least one sensor;
   a second modulator, configured to adjust a radiation dose of a pulse of radiation in said second pulsed sub-beam of radiation based on the radiation dose determined by said at least one sensor; and
   one or more radiation sinks, configured to absorb excess radiation directed from at least one of the first or second modulator.

2. The lithographic apparatus according to claim 1, wherein said radiation beam divider divides the pulsed beam of radiation into at least three pulsed sub-beams of radiation and the lithographic apparatus further comprises:
   a plurality of radiation pulse modulators, each of the plurality of radiation pulse modulators being associated with one of said pulsed sub-beams of radiation and configured to adjust the radiation dose of a pulse of radiation in the respective pulsed sub-beam of radiation based on the radiation dose of said pulse determined by said at least one sensor.

3. The lithographic apparatus according to claim 1, wherein the lithographic apparatus further comprises:
   another sensor, configured to determine a radiation dose within a pulse of radiation in said pulsed beam of radiation before said pulsed beam of radiation is divided by the radiation beam divider; and
   wherein the first and second radiation pulse modulators adjust respective ones of the radiation doses of first and second pulses of radiation in the first and second pulsed sub-beams of radiation, respectively, based on the determination by said another sensor of a radiation dose of a corresponding one of the pulse of radiation in the pulsed beam of radiation before said pulsed beam of radiation is divided into said first and second pulses of radiation by the radiation beam divider.

4. The lithographic apparatus according to claim 1, wherein the lithographic apparatus further comprises:
   an additional plurality of sensors, configured to determine radiation doses of the first and second pulses of radiation within respective first and second sub-beams of radiation; and
   wherein the first and second radiation pulse modulators adjust respective ones of the radiation doses of said first and second pulses, respectively, based on the determination by said additional plurality of sensors of the respective radiation doses of said first and second pulses of radiation.

5. The lithographic apparatus according to claim 1, wherein the optical delay component is configured to delay a pulse of radiation of said pulsed beam of radiation before said pulsed beam of radiation is divided into said first and second pulsed sub-beams of radiation by the radiation beam divider.

6. The lithographic apparatus according to claim 1, wherein the lithographic projection apparatus further comprises an additional plurality of optical delay components, the additional plurality of optical delay components configured to delay pulses of radiation in said first and second pulsed sub-beams of radiation, respectively.

7. The lithographic apparatus according to claim 1, wherein said optical delay component is configured to delay a pulse of radiation in said first pulsed sub-beam of radiation and a pulse of radiation in said second pulsed sub-beam of radiation.

8. The lithographic apparatus according to claim 1, further comprising:
a first array of individually controllable elements, configured to modulate pulses of radiation in said first pulsed sub-beam of radiation; and
a second array of individually controllable elements, configured to modulate pulses of radiation in said second pulsed sub-beam of radiation.

9. The lithographic apparatus according to claim 1, further comprising:
at least one additional radiation beam divider, configured to divide at least one of said first and second pulsed sub-beams of radiation after a respective one of the first or second radiation pulse modulator adjusts a radiation dose of pulses of said first or said second pulsed sub-beams of radiation; and
a plurality of arrays of individually controllable elements, configured such that each array of the plurality of arrays of individually controllable elements modulates pulses of radiation from one of the first and second pulsed sub-beams of radiation and the further divided pulsed sub-beams of radiation.

10. The lithographic apparatus according to claim 1, wherein at least one of said first and second radiation pulse modulators comprises:
a pockels cell configured to rotate an orientation of linearly polarized radiation input into the pockels cell to an extent dependent on a control voltage applied to it; and
a polarizing filter, configured to transmit radiation to an extent dependent on the orientation of the linearly polarized radiation.

11. The lithographic apparatus according to claim 10, wherein the polarizing filter is a polarizing beam splitter configured to reflect radiation linearly polarized in a first orientation and to transmit radiation linearly polarized in a second orientation, orthogonal to the first orientation; and
wherein one of the radiation reflected by the polarizing beam splitter and the radiation transmitted by the polarizing beam splitter is directed to a next component in a beam path of an associated one of the first or second pulsed sub-beam of radiation.

12. The lithographic apparatus according to claim 11, wherein the one of the radiation reflected by the polarizing beam splitter and the radiation transmitted by the polarizing beam splitter not directed to the next component, is directed to the one or more radiation sinks, configured to absorb the radiation.

13. The lithographic apparatus according to claim 12, wherein said first and second radiation pulse modulators share the one or more radiation sinks.

14. The lithographic apparatus according to claim 1, wherein at least one of the first and second radiation pulse modulators is configured to adjust the radiation dose of a pulse of radiation by transmitting the pulse of radiation at substantially full intensity for a first period of time and substantially no radiation for a second period of time.

15. The lithographic apparatus according to claim 1, wherein at least one of the first and second radiation pulse modulators is configured to adjust a radiation dose of a pulse of radiation by reducing an intensity of the radiation of the pulse by a substantially constant factor for duration of said pulse.

16. The lithographic apparatus according to claim 1, wherein the adjusted dose of a pulse of radiation adjusted by said first radiation pulse modulator is substantially the same as the adjusted dose of a pulse of radiation adjusted by said second radiation pulse modulator.

17. The lithographic apparatus according to claim 1, further comprising:
a dose controller configured to determine first and second predetermined radiation doses for pulses of radiation in the first and second pulsed sub-beams of radiation, respectively and to control the first and second radiation pulse modulators to adjust doses of pulses of radiation in the first and second pulsed sub-beams of radiation to said first and second predetermined radiation doses, respectively.

18. A device manufacturing method, comprising:
dividing a pulsed beam of radiation into at least first and second pulsed sub-beams of radiation;
determining a radiation dose of at least one pulse of radiation of said pulsed beam of radiation or at least one of said first and second pulsed sub-beams of radiation;
delaying said pulse of radiation in an optical delay component after the radiation dose of the pulse of radiation has been determined;
adjusting a radiation dose of a pulse of radiation in said first pulsed sub-beam of radiation based on said determined radiation dose of said at least one pulse of radiation; and
adjusting a radiation dose of a pulse of radiation in said second pulsed sub-beam of radiation based on said determined radiation dose of said at least one pulse of radiation,
wherein at least one of the adjusting steps comprises absorbing excess radiation in a radiation sink.

19. The device manufacturing method according to claim 18, further comprising projecting the respective adjusted radiation doses of the first and second pulsed sub-beams onto a substrate.

20. The device manufacturing method according to claim 19, wherein the substrate is one of a flat panel display and an integrated circuit device.

21. A radiation supply system, comprising:
a radiation beam divider configured to divide a pulsed beam of radiation into at least first and second pulsed sub-beams of radiation;
at least one sensor, configured to determine a radiation dose within a pulse of radiation in the pulsed beam of radiation or at least one of the first and second pulsed sub-beams of radiation;
an optical delay component, configured to delay a pulse of radiation after the radiation dose of the pulse of radiation has been determined by the sensor;
a first modulator, configured to adjust a radiation dose of a pulse of radiation in said first pulsed sub-beam of radiation based on the radiation dose of said pulse of radiation determined by said at least one sensor;
a second modulator, configured to adjust the radiation dose of a pulse of radiation in said second pulsed sub-beam of radiation based on the radiation dose of said pulse of radiation determined by said at least one sensor; and
one or more radiation sinks, configured to absorb excess radiation directed from at least one of the first or second modulator.

* * * * *